(12) United States Patent
Satou (10) Patent No.: US 7,122,131 B2
(45) Date of Patent: Oct. 17, 2006

(54) CONDUCTIVE PASTE FOR VIA CONDUCTOR, CERAMIC WIRING BOARD USING THE SAME, AND METHOD OF MANUFACTURING THE SAME

(75) Inventor: Hisashi Satou, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/067,483

(22) Filed: Feb. 25, 2005

(65) Prior Publication Data

US 2005/0194575 A1 Sep. 8, 2005

(30) Foreign Application Priority Data

Feb. 26, 2004 (JP) .............................. 2004-052531

(51) Int. Cl.
*H01B 1/00* (2006.01)
*C03B 29/00* (2006.01)
(52) U.S. Cl. ....................... 252/500; 252/512; 252/513; 252/519; 252/62.2; 156/89.18; 156/89.11; 216/13; 216/17; 216/18; 361/303; 428/357
(58) Field of Classification Search ................ 252/500, 252/512, 513, 519, 62.3 R, 62.2; 156/89.18, 156/89.11; 216/13, 17, 18; 361/303; 428/357
See application file for complete search history.

(56) References Cited

U.S. PATENT DOCUMENTS

| 6,827,880 B1* | 12/2004 | Ishimatsu ................... 252/511 |
| 2001/0001481 A1* | 5/2001 | Sanada et al. ........... 252/518.1 |

FOREIGN PATENT DOCUMENTS

JP 2003-229325 * 8/2003

* cited by examiner

*Primary Examiner*—Mark Kopec
*Assistant Examiner*—Kallambella Vijayakumar
(74) *Attorney, Agent, or Firm*—Hogan & Hartson LLP (57) ABSTRACT

The present invention is directed to a conductive paste for via conductor, comprising a Cu powder having a glass layer formed on the surface, a Ni powder having a metal oxide layer formed on the surface, and a ceramic component homogeneous as that of a ceramic component contained in a green sheet, a ceramic wiring board such as laminated ceramic capacitor, comprising via conductors formed of the same, and a method of manufacturing the same. According to the present invention, via conductors having excellent electrical conductivity can be formed by preventing the formation of a Cu—Ni alloy due to the reaction of the Cu powder and the Ni powder.

6 Claims, 5 Drawing Sheets

CONDUCTIVE PASTE FOR VIA CONDUCTOR, CERAMIC WIRING BOARD USING THE SAME, AND METHOD OF MANUFACTURING THE SAME

BACKGROUND OF THE INVENTION

The present invention relates to a conductive paste for via conductor which is fired together with a green sheet containing a ceramic component to form via conductors in the state of being filled in through holes formed in the green sheet, and to a ceramic wiring board comprising via conductors formed of the conductive paste for via conductor, and a method of manufacturing the ceramic wiring board.

When manufacturing ceramic wiring boards constituting electronic components such as laminated ceramic capacitors, particularly those having a laminated structure of two or more layers, such a design is increasingly employed in recent years that conductor wirings provided in the laminated structure are conductively connected to via conductors which penetrate through the ceramic wiring board in the lamination direction, in order to decrease equivalent series resistance and equivalent series inductance of the conductor wirings.

Figure 5:
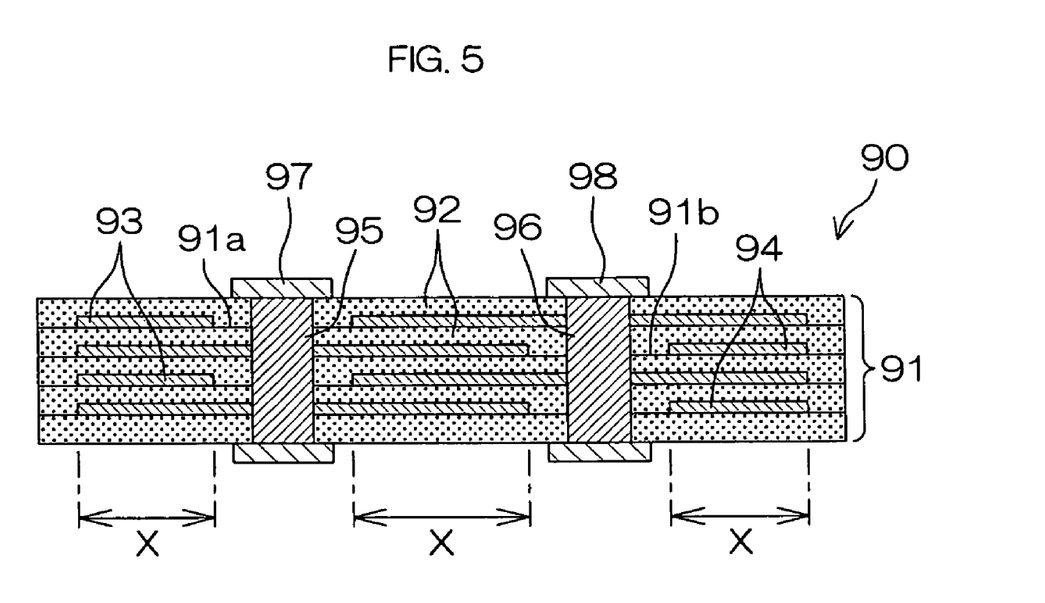
FIG. 5 is a cross-sectional view showing a laminated ceramic capacitor as an example of a ceramic wiring board of the prior art.

FIG. 5 is a cross-sectional view showing an example of a laminated ceramic capacitor 90 having the structure described above.

Referring to FIG. 5, the laminated ceramic capacitor 90 of this example is provided with a dielectric block 91 comprising a plurality of dielectric layers 92 made of ceramics laminated one upon another.

A plurality of internal electrodes 93, 94 are provided as conductor wirings alternately between the respective dielectric layers 92 which constitute the dielectric block 91.

The dielectric block 91 has via conductors 95, 96 formed to penetrate therethrough in the lamination direction, and has an external electrode 97 which is conductively connected to the via conductor 95 and an external electrode 98 which is conductively connected to the via conductor 96, both formed on the surface of the dielectric block 91.

The internal electrode 93 is provided on the upper surface of the dielectric layer 92 which is the even-numbered layer, assuming that the uppermost layer is the first layer, in the dielectric block 91 shown in the figure, and is conductively connected to the via conductor 96 and the external electrode 98 in such a configuration as an area 91a without any electrode formed therein is provided around the via conductor 95 so as to isolate from the via conductor 95.

The internal electrode 94 is provided on the upper surface of the dielectric layer 92 which is the odd-numbered layer (except for the uppermost layer, namely the first dielectric layer 92), assuming that the uppermost layer is the first layer, in the dielectric block 91 shown in the figure, and is conductively connected to the via conductor 95 and the external electrode 97 in such a configuration as an area 91b without any electrode formed therein is provided around the via conductor 96 so as to isolate from the via conductor 96.

Thus a circuit which functions equivalently as a capacitor is constituted in which the internal electrode 93 which is conductively connected to the external electrode 98 through the via conductor 96, and the internal electrode 94 which is conductively connected to the external electrode 97 through the via conductor 95 are disposed to oppose each other via the dielectric layer 92 in the region X shown in the figure.

The dielectric layer 92 is formed by firing a green sheet containing a ceramic component and an organic binder resin.

The internal electrodes 93, 94 are formed by applying a conductive paste for conductor wiring, which contains Ni as a conductive component and an organic binder resin, onto the surface of the green sheet by screen printing, for example, in a predetermined planar configuration and firing the paste together with the green sheet.

The via conductors 95, 96 are formed by firing the conductive paste for via conductor together with the green sheet in the state of being filled in the through holes formed in the green sheet.

As the conductive paste for via conductor, a conductive paste containing a Cu powder, a Ni powder, a ceramic component and an organic binder resin is preferably used as described in Japanese Unexamined Patent Publication No. 2003-229325.

In the conductive paste for via conductor described above, the Cu powder forms a solid solution with the Ni powder when fired, so as to suppress the via conductors 95, 96 from shrinking due to firing, thereby to form satisfactory conductive connection of the via conductors with the internal electrodes 93, 94.

The ceramic component suppresses sintering of the conductive paste for via conductor from proceeding faster than firing of the green sheet during firing.

Therefore, cracking can be prevented from occurring in the laminated ceramic capacitor 90.

In the firing step to form ceramic wiring boards such as the laminated ceramic capacitor 90 described above, introducing oxygen of a predetermined concentration in the course of firing is a common practice for the purpose of fully burning and decomposing the organic binder resin contained in the green sheet and in the conductive paste which may otherwise cause internal defects such as delamination.

Also, the formation of the Cu—Ni alloy from Cu and Ni metal powders during sintering increases the electrical resistance of the via conductor and deteriorates the electrical conductivity.

SUMMARY OF THE INVENTION

An object of the present invention is to prevent the formation of a Cu—Ni alloy due to the reaction of the Cu powder and the Ni powder and to provide a conductive paste for via conductor, which can form via conductors having more excellent electrical conductivity as compared with the prior art.

Another object of the present invention is to provide a ceramic wiring board comprising via conductors formed of the conductive paste for via conductor, and a method of manufacturing the same.

The conductive paste for via conductor of the present invention comprises a Cu powder having a glass layer formed on the surface, a Ni powder having a metal oxide layer formed on the surface, and a ceramic component homogeneous as that of the ceramic component contained in the green sheet.

According to the conductive paste for via conductor of the present invention, since the surface of the Cu powder is coated with the glass layer and also the surface of the Ni powder is coated with the metal oxide layer, it is possible to effectively prevent the formation of a Cu—Ni alloy due to the reaction of the Cu powder and the Ni powder.

Therefore, it becomes possible to form via conductors having excellent electrical conductivity.

In the conductive paste for via conductor of the present invention, a volume ratio Va of the Cu powder, a volume ratio Vb of the Ni powder and a volume ratio Vc of the ceramic component preferably satisfy all relations (1) to (5).

$$0.01 \leq Va \leq 0.1 \quad (1)$$

$$0.9 \leq Vb \leq 0.99 \quad (2)$$

$$0.01 \leq Vc \leq 0.3 \quad (3)$$

$$Va + Vb = 1 \quad (4)$$

$$1.01 \leq Va + Vb + Vc \leq 1.3 \quad (5)$$

If the volume ratios Va to Vc are respectively set within the above ranges, a ceramic wiring board having excellent characteristics can be manufactured by effectively exerting both of a function of the Cu powder and that of the ceramic component, described hereinabove.

The function of the Cu powder is to form more satisfactory conductive connection of the via conductors with conductor wirings such as internal electrode.

Also the function of the ceramic component can suppress sintering of the conductive paste for via conductor from proceeding faster than firing of the green sheet during firing, thereby to more securely prevent cracking from occurring in the ceramic wiring board.

In the conductive paste for via conductor of the present invention, an average thickness of the glass layer formed on the surface of the Cu powder is preferably from 5.0 to 50 nm, and an average thickness of the metal oxide layer formed on the surface of the Ni powder is preferably from 1.0 to 20 nm.

If the average thickness of the glass layer and that of the metal oxide layer are respectively set within the above ranges, more excellent electrical conductivity can be imparted to the via conductors by more securely preventing the formation of a Cu—Ni alloy due to the reaction of the Cu powder and the Ni powder.

In the conductive paste for via conductor of the present invention, an average particle diameter of the Cu powder is preferably from 0.1 to 1.0 μm, an average particle diameter of the Ni powder is preferably from 0.1 to 10 μm, and an average particle diameter of the ceramic component is preferably from 0.1 to 1.0 μm.

If the average particle diameter of the Cu powder, that of the Ni powder and that of the ceramic component are respectively set within the above ranges, the Cu powder, the Ni powder and the ceramic component can be uniformly dispersed in the conductive paste for via conductor without causing agglomeration.

Therefore, it is made possible to effectively prevent the formation of a Cu—Ni alloy due to the reaction of the Cu powder and the Ni powder during firing and to prevent uneven distribution of the Cu powders and the Ni powders in via conductors, thereby to impart more excellent and uniform electrical conductivity to the via conductors.

Also it is made possible to suppress sintering of the conductive paste for via conductor from proceeding faster than firing of the green sheet during firing, thereby to more securely prevent cracking from occurring in the ceramic wiring board.

As the Ni powder, two kinds of Ni powders having different average particle diameters within the above ranges are preferably used in combination. When Ni powders having different average particle sizes are used in combination, it is made possible to enhance the pack density of the Ni powder and to impart more excellent and uniform electrical conductivity to the via conductors. Also it is made possible to suppress the via conductors from shrinking during firing, thereby to form more satisfactory conductive connection of the via conductors with conductor wirings such as internal electrode.

The ceramic wiring board of the present invention comprises via conductors formed by firing the conductive paste for via conductor of the present invention.

Therefore, according to the ceramic wiring board of the present invention, it is made possible to improve electrical conductivity of the via conductors and to form satisfactory conductive connection of the via conductors with conductor wirings.

Therefore, particularly in a ceramic wiring board having a laminated structure comprising two or more layers, equivalent series resistance and equivalent series inductance of conductor wirings provided in the laminated structure can be decreased.

Also it is made possible to suppress sintering of the conductive paste for via conductor from proceeding faster than firing of the green sheet during firing, thereby to more securely prevent cracking from occurring in the ceramic wiring board.

The method of manufacturing a ceramic wiring board comprising via conductors of the present invention comprises the steps of forming through holes in a green sheet; filling the through holes thus formed with the conductive paste for via conductor of claim 1; applying a conductive paste for conductor wiring containing Ni as a conductive component, which is fired to form conductor wirings, onto the surface of the green sheet so as to contact a portion of the conductive paste for conductor wiring with the conductive paste for via conductor filled in the through holes; and simultaneously firing the green sheet, the conductive paste for via conductor, and the conductive paste for conductor wiring.

According to the method of the present invention, it is made possible to efficiently manufacture a ceramic wiring board, which is excellent in electrical conductivity as described above and comprises via conductors connected satisfactorily with conductor wirings and is also free from cracking, through the above respective steps.

To manufacture a ceramic wiring board having a laminated structure of two or more layers by the method of the present invention, it is preferred that the method further comprises the step of laying a plurality of green sheets, the through holes in which are filled with the conductive paste for via conductor, and the surface of which is coated with the conductive paste for conductor wiring, one upon another before firing, a plurality of the green sheets laid one upon another being integrated by firing.

The method of manufacturing a ceramic wiring board comprises the steps of applying a conductive paste for conductor wiring containing Ni as a conductive component, which is fired to form a conductor wiring, onto the surface of the green sheet so as to overlap a portion of the conductive paste for conductor wiring and the region, wherein through holes are formed, of the green sheet; forming the through holes in the green sheet and removing the conductive paste for conductor wiring which overlaps with the through holes; filling the through holes thus formed with the conductive paste for via conductor of claim 1 so as to contact the conductive paste for via conductor with a portion of the conductive paste for conductor wiring applied on the surface of the green sheet; and simultaneously firing the green sheet, the conductive paste for via conductor, and the conductive paste for conductor wiring.

According to the method of the present invention, it is made possible to efficiently manufacture a ceramic wiring board, which is excellent in electrical conductivity as described above and comprises via conductors connected satisfactorily with conductor wirings and is also free from cracking, through the above respective steps.

To manufacture a ceramic wiring board having a laminated structure of two or more layers by the method of the present invention, it is preferred that the method further comprises the step of laying a plurality of green sheets, the surface of which is coated with the conductive paste for conductor wiring, one upon another before forming through holes, wherein a plurality of the green sheets laid one upon another are penetrated to form through holes and, after filling with the conductive paste for via conductor, a plurality of the green sheets laid one upon another are integrated by firing.

DETAILED DESCRIPTION OF THE INVENTION

The conductive paste for via conductor of the present invention comprises a Cu powder having a glass layer formed on the surface, a Ni powder having a metal oxide layer formed on the surface, and a ceramic component homogeneous as that of the ceramic component contained in the green sheet.

The glass layer formed on the surface of the Cu powder includes, for example, layers formed of one or more kinds of silicate glasses such as quartz glass ($SiO_2$), soda-lime glass ($Na_2O$—$CaO$—$SiO_2$), potash-lime glass ($K_2O$—$CaO$—$SiO_2$), alkali glass ($K_2O$—$PbO$—$SiO_2$), barium glass ($BaO$—$SiO_2$—$B_2O_3$) and borosilicate glass ($Na_2O$—$B_2O_3$—$SiO_2$).

The average thickness of the glass layer is preferably from 5.0 to 50 nm.

When the average thickness of the glass layer is less than 5.0 nm, sufficient effect of preventing the formation of a Cu—Ni alloy due to the reaction of the Cu powder and the Ni powder may not be exerted by the glass layer.

On the other hand, when the average thickness of the glass layer is more than 50 nm, sufficient effect of forming satisfactory conductive connection of via conductors with the conductor wirings by forming a solid solution of the Cu powder and the Ni powder may not be exerted.

The average thickness of the glass layer is determined by the following procedure. That is, a Cu powder having a glass layer formed on the surface is mixed with a thermosetting resin to obtain a paste and the paste is thermoset by heating to a temperature of 150 to 200° C. to form a solid sample. The resulting sample is polished and the polished surface is mirror-polished with a diamond paste. Using a scanning electron microscope (magnification: 8000 or more), the thickness of the glass layer is measured, with respect to a plurality of particles of the Cu powder exposed to the polished surface, and then averaged.

Actually, the entire surface of the Cu powder is not always coated with the glass layer, though it depends on the formation method.

In that case, when the average thickness of the glass layer determined by the procedure described above is within the above preferred range, it is possible to prevent the formation of a Cu—Ni alloy due to the reaction of the Cu powder and the Ni powder.

Therefore, the entire surface of the Cu powder may be coated with the glass layer, or a portion of the surface may be exposed.

The average particle diameter of the Cu powder is preferably from 0.1 to 1.0 μm.

When the average particle diameter of the Cu powder is less than 0.1 μm or more than 1.0 μm, the Cu powder is likely to be agglomerated in the conductive paste for via conductor.

Therefore, the Ni powder and the ceramic component are also likely to be agglomerated, and thus it may become impossible to effectively prevent the formation of a Cu—Ni alloy due to the reaction of the Cu powder and the Ni powder during firing.

Also uneven distribution of the Cu powders and the Ni powders in via conductors may occur to cause poor or non-uniform electrical conductivity of the via conductors.

The smaller the particle diameter of the Cu powder, a solid solution of the Cu powder and the Ni powder can be formed by firing more effectively.

Therefore, it is made possible to suppress the conductive paste for via conductors from shrinking during firing, thereby to form satisfactory conductive connection of the via conductors with the conductor wirings.

Consequently, the smaller the average particle diameter of the Cu powder within the above range, the better.

The average particle diameter of the Cu powder is expressed by an average value of the Cu powder itself in the state where no glass layer is formed, and is determined by the following procedure. That is, using a scanning electron microscope (magnification: 8000 or more), the particle diameter is measured with respect to a plurality of particles of the Cu powder, and then averaged.

The Cu powder having a glass layer formed on the surface can be produced. That is, by an atomized pyrolysis method. For example, a Cu powder having a $SiO_2$ layer as the glass layer is produced by spraying a Cu powder and a compound containing Si in a reducing atmosphere to deposit the compound on the surface of the Cu powder, and thermally decomposing the compound in an oxidizing atmosphere such as atmospheric air to form $SiO_2$.

Examples of the metal oxide layer formed on the surface of the Ni powder includes layers made of a metal oxide which is more stable than the Ni powder at high temperature, for example, layer made of an oxide of Ni, Al, Y, Zr, Ti, Mg, Ca, Sr or Ba alone, layer made of a mixture of two or more kinds of the above oxides, layer made of a complex oxide containing two or more kinds of the above metals, and layer made of a complex oxide of the above metals and other metals.

The average thickness of the metal oxide layer is preferably from 1.0 to 20 nm. When the average thickness of the metal oxide layer is less than 1.0 nm, sufficient effect of preventing the formation of a Cu—Ni alloy due to the reaction of the Cu powder and the Ni powder may not be exerted by the metal oxide layer.

On the other hand, when the average thickness of the metal oxide layer is more than 20 nm, sufficient effect of forming satisfactory conductive connection of via conductors to the conductor wiring by forming a solid solution of the Cu powder and the Ni powder may not be exerted.

The average thickness of the metal oxide layer can be determined by the same procedure as in case of the average thickness of the glass layer.

That is, a Ni powder having a metal oxide layer formed on the surface is mixed with a thermosetting resin to obtain a paste and the paste is thermoset by heating to a temperature of 150 to 200° C. to form a solid sample. The resulting sample is polished and the polished surface is mirror-polished with a diamond paste. Using a scanning electron microscope (magnification: 8000 or more), the thickness of the metal oxide layer is measured, with respect to a plurality of particles of the Ni powder exposed to the polished surface, and then averaged.

Actually, the entire surface of the Ni powder is not always coated with the metal oxide layer, though it depends on the formation method.

In that case, when the average thickness of the metal oxide layer determined by the procedure described above is within the above preferred range, it is possible to prevent the formation of a Cu—Ni alloy due to the reaction of the Cu powder and the Ni powder.

Therefore, the entire surface of the Ni powder may be coated with the glass layer, or a portion of the surface may be exposed.

The average particle diameter of the Ni powder is preferably from 0.1 to 10 μm.

When the average particle diameter of the Ni powder is less than 0.1 μm or more than 10 μm, the Ni powder is likely to be agglomerated in the conductive paste for via conductor.

Therefore, the Cu powder and the ceramic component are also likely to be agglomerated, and thus it may become impossible to prevent the formation of a Cu—Ni alloy due to the reaction of the Cu powder and the Ni powder during firing.

Also uneven distribution of the Cu powders and the Ni powders in via conductors may occur to cause poor or non-uniform electrical conductivity of the via conductors.

As the Ni powder, two kinds of Ni powders having different average particle diameters within the above range are preferably used in combination. When two kinds of Ni powders having different average particle diameters are used in combination, it is made possible to enhance the pack density of the Ni powder and to impart more excellent and uniform electrical conductivity to the via conductors. Also it is made possible to suppress the via conductors from shrinking during firing, thereby to form more satisfactory conductive connection of the via conductors with conductor wirings such as internal electrode. With respect to a ratio of the particle diameter of two kinds of Ni powders to be used in combination, the average particle diameter of the Ni powder having a small particle diameter preferably accounts for 5 to 35% of the average particle diameter of the Ni powder having a large particle diameter. Even when the average particle diameter of the Ni powder having a small particle diameter is smaller or larger than the above range, sufficient effect of enhancing the pack density of the Ni powder may not be exerted. With respect to two kinds of Ni powders, 100 parts by weight of the Ni powder having a large particle diameter is preferably mixed with 10 to 35 parts by weight of the Ni powder having a small particle diameter. Even when the amount of the Ni powder having a small particle diameter is smaller or larger than the above range, sufficient effect of enhancing the pack density of the Ni powder may not be exerted.

The average particle diameter of the Ni powder is expressed by an average value of the Ni powder itself in the state where no metal oxide layer is formed on the surface, and is determined by the following procedure. That is, using a scanning electron microscope (magnification: 8000 or more), the particle diameter is measured with respect to a plurality of particles of the Ni powder, and then averaged.

The Ni powder having a metal oxide layer formed on the surface can be produced, for example, by an atomized pyrolysis method. That is, a Ni powder having a metal oxide layer formed on the surface produced by spraying a Ni powder and a compound containing a metal as a base of a metal oxide in a reducing atmosphere to deposit the compound on the surface of the Ni powder, thermally decomposing the compound in an oxidizing atmosphere such as atmospheric air, and subjecting to an oxidizing treatment to form a metal oxide.

When the metal oxide layer is a layer of an oxide of Ni, a metal oxide layer having a predetermined thickness can be formed only by controlling the concentration of oxygen after spraying. Usually, the metal oxide layer having a predetermined thickness can be formed only by controlling heat treatment conditions.

As the ceramic component, for example, there can be used ceramic components homogeneous as that of the ceramic component contained in the green sheet, namely, various ceramic components which have a function of suppressing sintering of the conductive paste for via conductor from proceeding faster than firing of the green sheet because of the same or similar main component and similar sintering behavior or temperature characteristics during firing.

For example, when the green sheet contains barium titanate ($BaTiO_3$) as the main component of the ceramic component, the same $BaTiO_3$ is preferably used as the ceramic component of the conductive paste for via conductor.

The average particle diameter of the ceramic component is preferably from 0.1 to 1.0 μm.

When the average particle diameter of the ceramic component is less than 0.1 μm or more than 1.0 μm, the ceramic component is likely to be agglomerated in the conductive paste for via conductor.

Therefore, the Cu powder and the Ni powder are also likely to be agglomerated, and thus it may become impossible to prevent the formation of a Cu—Ni alloy due to the reaction of the Cu powder and the Ni powder during firing.

Also uneven distribution of the Cu powders and the Ni powders in via conductors may occur to cause poor or non-uniform electrical conductivity of the via conductors.

The average particle diameter of the ceramic component is determined by the following procedure. That is, using a scanning electron microscope (magnification: 8000 or more), the particle diameter is measured with respect to a plurality of particles of the ceramic component, and then averaged.

In the conductive paste for via conductor of the present invention, a volume ratio Va of the Cu powder, a volume ratio Vb of the Ni powder and a volume ratio Vc of the ceramic component preferably satisfy all relations (1) to (5).

$$0.01 \leq Va \leq 0.1 \quad (1)$$

$$0.9 \leq Vb \leq 0.99 \quad (2)$$

$$0.01 \leq Vc \leq 0.3 \quad (3)$$

$$Va+Vb=1 \quad (4)$$

$$1.01 \leq Va+Vb+Vc \leq 1.3 \quad (5)$$

When the volume ratio Va of the Cu powder is less than 0.01, sufficient effect of forming satisfactory conductive connection of the via conductors with the conductor wirings due to suppressing of shrinking of the via conductors during firing by forming a solid solution of the Cu powder and the Ni powder may not be exerted.

When the volume ratio Va is more than 0.1, since Cu has a melting point lower than that of Ni and is likely to be vaporized during firing and also sintering rapidly proceeds, voids in the via conductors may increase to decrease the electrical conductivity of the via conductors and also the via conductors may cause large shrinking and failed to form satisfactory conductive connection of the via conductors with the conductor wirings.

When the volume ratio Vb of the Ni powder is less than 0.9, since the volume ratio Va of the Cu powder relatively increases, voids in the via conductors may increase to decrease the electrical conductivity of the via conductors and also the via conductors may cause large shrinking and failed to form satisfactory conductive connection of the via conductors with the conductor wirings, similarly.

When the volume ratio Vb is more than 0.99, since the volume ratio Va of the Cu powder relatively decreases, sufficient effect of forming satisfactory conductive connection of via conductors with the conductor wiring due to suppressing of shrinking of the via conductors during firing by forming a solid solution of the Cu Powder and the Ni Powder may not be exerted.

When the volume ratio Vc of the ceramic component is less than 0.01, sufficient effect of preventing cracking from occurring in the ceramic wiring board may not be exerted by suppressing sintering of the conductive paste for via conductor from proceeding faster than firing of the green sheet during firing.

When the volume ratio Vc of the ceramic component is more than 0.3, since the volume ratios Va and Vb of the Cu powder and the Ni powder relatively decrease, the electrical conductivity of the via conductors may deteriorate.

The conductive paste for via conductor may contain, in addition to the Cu powder, the Ni powder and the ceramic component, an organic binder resin and a solvent.

As the organic binder resin, for example, there can be used various resins, which can uniformly disperse therein the Cu powder, the Ni powder and the ceramic component and also can impart the viscosity and rheology, which are suited to a method of filling through holes formed in the green sheet (for example, screen printing), to the conductive paste for via conductor.

Examples of the organic binder resin include acrylic resin, phenol resin, alkyd resin, rosin ester, ethyl cellulose, methyl cellulose, polyvinyl alcohol and polyvinyl butyral.

As the solvent, for example, there can be used various solvents which dissolve the organic binder resin and disperse therein the Cu powder, the Ni powder and the ceramic component to form a mixture in the form of a paste.

Examples of the solvent include alcohol solvents (i.e. α-terpineol, benzyl alcohol), hydrocarbon solvents, ether solvents, ester solvents (i.e. diethylene glycol monobutyl ether acetate) and naphtha.

Among these solvents, alcohol solvents such as α-terpineol are particularly preferable so as to improve the dispersibility of the Cu powder and the Ni powder.

The contents of the organic binder resin and the solvent can be set within a suitable range so as to impart the viscosity and rheology, which are suited to the method of filling through holes formed in the green sheet, to the conductive paste for via conductor.

The conductive paste for via conductor may also contain dispersants, activators and plasticizers, etc, if necessary.

The ceramic wiring board of the present invention comprises via conductors formed by firing the conductive paste for via conductor of the present invention.

Figure 1:
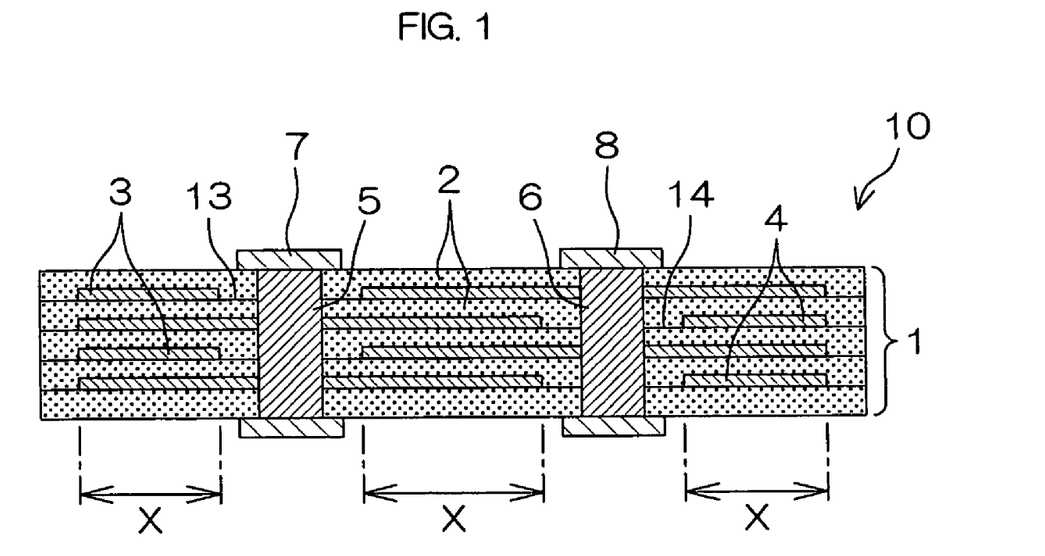
FIG. 1 is a cross-sectional view showing a laminated ceramic capacitor as an example of a ceramic wiring board of the present invention, comprising via conductors formed of a conductive paste for via conductor of the present invention.

FIG. 1 is a cross-sectional view showing a laminated ceramic capacitor 10 as an embodiment of the ceramic wiring board of the present invention.

Referring to FIG. 1, the laminated ceramic capacitor 10 of this example is provided with a dielectric block 1 comprising a plurality of dielectric layers 2 made of ceramics laminated one upon another.

A plurality of internal electrodes 3, 4 are provided as conductor wirings alternately between the respective dielectric layers 2 which constitute the dielectric block 1.

The dielectric block 1 has via conductors 5, 6 formed to penetrate therethrough in the lamination direction, and has an external electrode 7 which is conductively connected to the via conductor 5 and an external electrode 8 which is conductively connected to the via conductor 6, both formed on the surface of the dielectric block 1.

The internal electrode 3 is provided on the upper surface of the dielectric layer 2 which is the even-numbered layer, assuming that the uppermost layer is the first layer, in the dielectric block 1 shown in the figure, and is conductively connected to the via conductor 6 and the external electrode 8 in such a configuration as an area 13 without any electrode formed therein is provided around the via conductor 5 so as to isolate from the via conductor 5.

The internal electrode 4 is provided on the upper surface of the dielectric layer 2 which is the odd-numbered layer (except for the uppermost layer, namely the first dielectric layer 2), assuming that the uppermost layer is the first layer, in the dielectric block 1 shown in the figure, and is conductively connected to the via conductor 5 and the external electrode 7 in such a configuration as an area 14 without any electrode formed therein is provided around the via conductor 6 so as to isolate from the via conductor 6.

Thus a circuit which functions equivalently as a capacitor is constituted in which the internal electrode 3 which is conductively connected to the external electrode 8 through the via conductor 6, and the internal electrode 4 which is conductively connected to the external electrode 7 through the via conductor 5 are disposed to oppose each other via the dielectric layer 2 in the region X shown in the figure.

The dielectric layer 2 is formed by firing a green sheet containing a ceramic component such as $BaTiO_3$ and an organic binder resin.

As described above, a green sheet containing a ceramic component such as $BaTiO_3$ and an organic binder resin is preferably used as the green sheet.

More specifically, the ceramic component is mixed with sintering agents, organic binder resins, plasticizers, dispersants and solvent to obtain a ceramic slurry, and the resulting ceramic slurry is formed into a sheet and dried to form a green sheet.

The method of forming the ceramic slurry into a sheet includes, for example, a doctor blade method, a dipping and drawing up method, a coating method using a die coater and a coating method using a gravure roll coater.

The ceramic component includes, for example, those obtained by adding dielectric materials such as magnesium titanate ($MgTiO_3$) and manganese titanate ($MnTiO_3$) as subspecies to $BaTiO_3$ as a main component and optionally mixing the mixture with rare earth metal compounds such as yttrium oxide ($Y_2O_3$).

A sintering agent has a function of decreasing a shrinking initiation temperature of the green sheet due to firing.

Examples of the sintering agent include liquid phase forming substance, which serves as the glass component, and metal oxide.

Examples of the organic binder resin include polyvinyl butyral resin, ethyl cellulosic resin and acrylic resin.

Examples of the plasticizer include polyethylene glycol and phthalate ester.

Examples of the solvent include water-soluble solvents such as water; organic solvents such as toluene, ethyl acetate and terpineol; and mixtures thereof.

Examples of the dispersant suitable use with water-soluble solvent include carboxylic acid type polymeric surfactants; and suitable use with organic solvent include polyoxyethylene ether amphoteric surfactants.

The internal electrodes 3, 4 are formed by applying a conductive paste for conductor wiring, which contains Ni as a conductive component and an organic binder resin, onto the surface of the green sheet by screen printing in a predetermined planar configuration and firing the paste together with the green sheet.

As the conductive paste for conductor wiring, a conductive paste containing a Ni powder and an organic binder resin is preferably used.

More specifically, a solvent capable of dissolving the organic binder resin is added to the Ni powder and the organic binder resin, thereby to dissolve the organic binder resin, and thus a conductive paste for conductor wiring is prepared.

To prevent agglomeration from occurring in the conductive paste for conductor wiring, a Ni powder having an average particle diameter of 0.1 to 10 µm is preferably used.

As the organic binder resin and the solvent thereof, for example, there can be listed the same organic binder resin and solvent as those listed in the above-mentioned conductive paste for via conductor.

The contents of the organic binder resin and the solvent can be a suitable range so as to impart the viscosity and rheology, which are suited to the method of applying onto the surface of the green sheet (for example, screen printing), to the conductive paste for conductor wiring.

The conductive paste for conductor wiring may also contain dispersants, activators and plasticizers, if necessary.

The via conductors 5, 6 are formed by firing the conductive paste for via conductor together with the green sheet in the state of being filled in the through holes formed in the green sheet.

The external electrodes 7, 8 are formed by firing together with the green sheet to form a dielectric block 1, and applying the same conductive paste for conductor wiring as that used in case of the internal electrodes 3, 4 onto the surface of the dielectric block 1 by screen printing in a predetermined planar configuration.

FIG. 2A to FIG. 2E are cross-sectional views showing the steps of manufacturing the laminated ceramic capacitor 10 by the method of the present invention.

Referring to these figures, according to this method, a green sheet 20 as a base of each dielectric layer 2 is prepared.

One green sheet 20 may be formed in the size corresponding to a single dielectric layer 2. However, in view of manufacturing efficiency, it is preferred to produce a plurality of laminates as a base of a dielectric block 1 by forming one green sheet 20 in the size including a plurality of regions corresponding a single dielectric layer 2, subjecting the respective regions to after-mentioned steps of forming through holes 15, 16, filling with conductive pastes for via conductor 50, 60 and applying conductive pastes for conductor wiring 30, 40, laying a plurality of green sheets 20 one upon another to form a laminate 11, and cutting out each region from the laminate 11 thus formed.

Figure 2A:
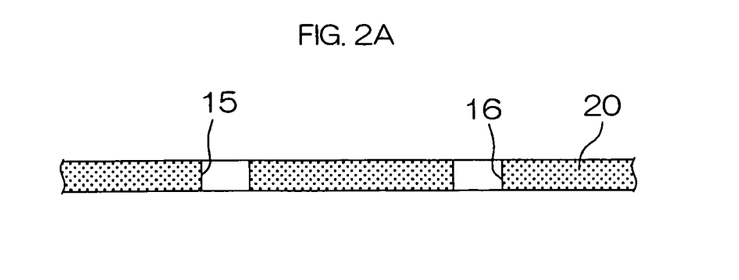
FIG. 2A to FIG. 2E are cross-sectional views showing the steps of manufacturing the laminated ceramic capacitor shown in FIG. 1 by the method of the present invention.

Then, by piercing at predetermined positions of each sheet 20 using a microdrill, or punching, through holes 15, 16 to be filled with the conductive paste for via conductor are formed (FIG. 2A).

The through holes 15, 16 are formed at the same position so as to lay a plurality of the green sheets 20 one upon another in a planar direction when laid one upon another.

When the through holes 15, 16 are formed in a comparatively small size, the surface of the green sheet 20 is preferably pierced by irradiation with UV-YAG laser, for example.

The remained machining scraps are preferably removed by ultrasonic cleaning of the green sheet 20 having through holes 15, 16 formed thereon while immersing in water.

Figure 2B:
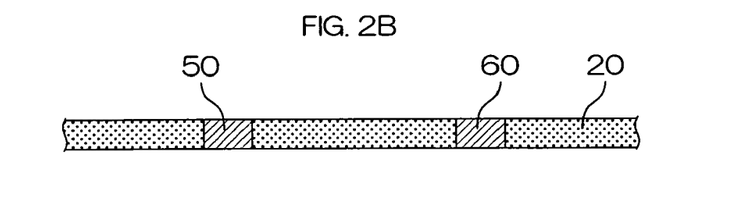

Then, the through holes 15, 16 thus formed are filled with the conductive pastes for via conductor 50, 60 by screen printing or the like (FIG. 2B).

Figure 2C:
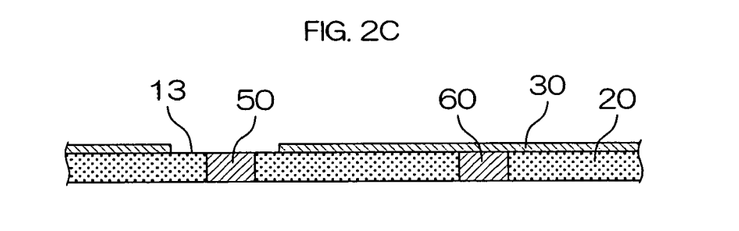

The conductive paste for conductor wiring 30 as a base of the internal electrode 3 is applied onto the surface of the green sheet 20 as a base of the dielectric layer 2 which is the even-numbered layer, assuming that the uppermost layer is the first layer, in the dielectric block 1 by screen printing in a predetermined planar configuration (FIG. 2C).

More specifically, the conductive paste for conductor wiring 30 is applied onto the conductive paste for via conductor 60 filled in the through hole 16 so as to contact with the conductive paste for via conductor 60 in such a configuration as a non-coated region 13 formed therein is provided around the through hole 15 so as to isolate from the conductive paste for via conductor 50 filled in the through hole 15.

Figure 2D:
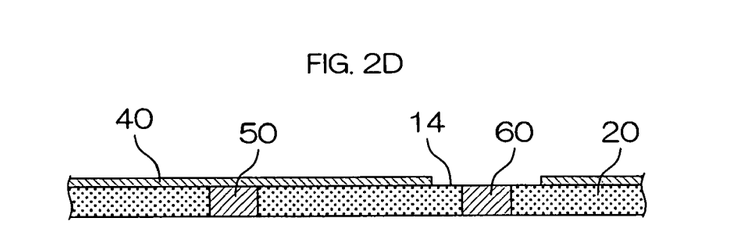

The conductive paste for conductor wiring 40 as a base of the internal electrode 4 is applied onto the surface of the green sheet 20 as a base of the dielectric layer 2 which is the odd-numbered layer (except for the uppermost layer, namely the first dielectric layer 2), assuming that the uppermost layer is the first layer, in the dielectric block 1 by screen printing or the like in a predetermined planar configuration (FIG. 2D).

More specifically, the conductive paste for conductor wiring 40 is applied onto the conductive paste for via conductor 50 filled in the through hole 15 so as to contact with the conductive paste for via conductor 50 in such a configuration as a non-coated region 14 formed therein is provided around the through hole 16 so as to isolate from the conductive paste for via conductor 60 filled in the through hole 16.

Figure 2E:
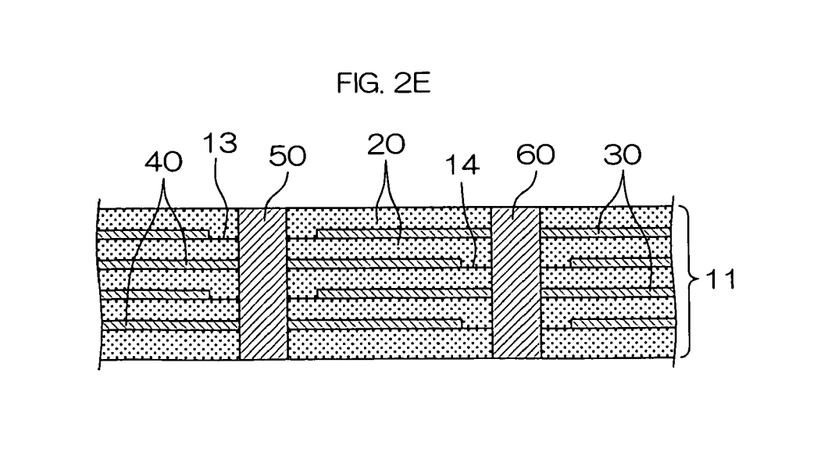

A plurality of two kinds of above green sheets 20 are alternately laid one upon another in the thickness direction while registering the through holes 15, 16, a top green sheet 20 for forming the uppermost layer (the first dielectric layer 2) is laid on the layers while registering the through holes 15, 16, and the pressure is applied from the top and bottom to form a laminate 11 (FIG 2E).

The top green sheet 20 is formed by filling with the conductive pastes for via conductor 50, 60, in the through holes 15, 16 as shown in FIG, 2B, and the conductive pastes for conductor wiring 30, 40 are not applied onto the surface.

The conductive paste for via conductor of the present invention having the same composition may be used as the conductive pastes for via conductor 50, 60 and the conductive pastes for conductor wiring 30, 40, and filling into the holes and application onto the sheet may be performed in a single step.

In this case, the manufacturing step can be simplified by omitting the registering and printing steps.

Two kinds of green sheet 20, which are alternately laid one upon another, may be replaced by a kind of a green sheet 20 which can be used as the above two kinds of green sheet 20 only by varying the lamination direction, while maintaining the same position of the through holes 15, 16 and the same application form of the conductive pastes for conductor wiring 30, 40.

In this case, the manufacturing step can be simplified by reducing the number of kinds of the green sheet 20.

As described above, when one green sheet 20 is formed in the size including a plurality of regions corresponding to a single dielectric layer 2, a laminate 11 is cut out every individual region using lever shears or the like. When the laminate 11 has a large thickness, it may be cut out by dicing.

The laminate thus cut out is put in a heating furnace and heated at a temperature of 250 to 400° C. to remove an organic binder resin and other organic substances, and then put in a great firing furnace and fired by heating to a temperature of 1250 to 1300° C. to form a dielectric block 1 shown in FIG. 1. Then, external electrodes 7, 8 are formed on the surface to obtain a laminated ceramic capacitor 10 shown in the same figure.

FIG. 3A to FIG. 3E are cross-sectional views showing the steps of manufacturing the laminated ceramic capacitor 10 by another method of the present invention.

Figure 3A:
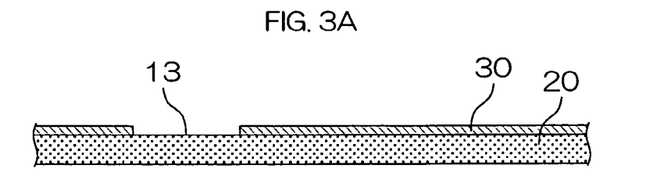
FIG. 3A to FIG. 3E are cross-sectional views showing the steps of manufacturing the laminated ceramic capacitor shown in FIG. 1 by another method of the present invention.

According to this method, the conductive paste for conductor wiring 30 as a base of the internal electrode 3 is applied onto the surface of the green sheet 20 as a base of the dielectric layer 2 which is the even-numbered layer, assuming that the uppermost layer is the first layer, in the dielectric block 1 by screen printing in a predetermined planar configuration (FIG. 3A).

More specifically, the conductive paste for conductor wiring 30 is applied onto the position where the through hole 16 is formed in the subsequent step so as to contact with the conductive paste for via conductor 60 filled in the through hole 16 in such a configuration as a non-coated region 13 formed therein is provided around the position where the through hole 15 is formed in the subsequent step so as to isolate from the conductive paste for via conductor 50 filled in the through hole 15.

Figure 3B:
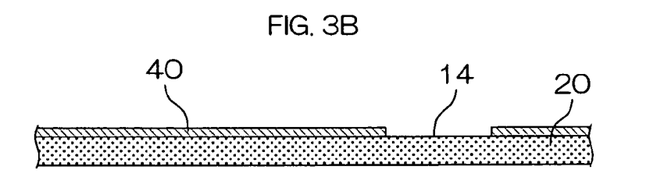

The conductive paste for conductor wiring 40 as a base of the internal electrode 4 is applied onto the surface of the green sheet 20 as a base of the dielectric layer 2 which is the odd-numbered layer (except for the uppermost layer, namely the first dielectric layer 2), assuming that the uppermost layer is the first layer, in the dielectric block 1 by screen printing in a predetermined planar configuration (FIG. 3B).

More specifically, the conductive paste for conductor wiring 40 is applied onto the position where the through hole 15 is formed in the subsequent step so as to contact with the conductive paste for via conductor 50 filled in the through hole 15 in such a configuration as a non-coated region 14 formed therein is provided around the position where the through hole 16 is formed in the subsequent step so as to isolate from the conductive paste for via conductor 60 filled in the through hole 16.

Similar to case of the above method, in view of manufacturing efficiency, it is preferred to produce a plurality of laminates as a base of a dielectric block 1 by forming the green sheet 20 in the size including a plurality of regions corresponding a single dielectric layer 2, subjecting the respective regions to the respective steps of applying the conductive pastes for conductor wiring 30, 40, forming through holes 15, 16 and filling with the conductive pastes for via conductor 50, 60 to form a laminate 11, and cutting out each region from the laminate 11 thus formed.

Figure 3C:
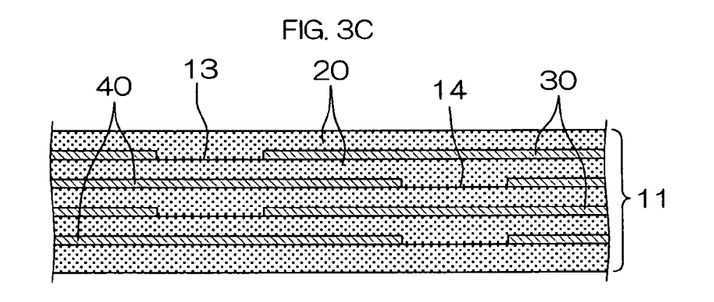

A plurality of two kinds of green sheet 20 are alternately laid one upon another in the thickness direction while registering and a top green sheet 20 for forming the uppermost layer is laid on the layers in the state where the conductive pastes for conductor wiring conductor 30, 40 are not applied onto the surface, and then pressure is applied from the top and bottom to form a laminate 11 (FIG. 3C).

Two kinds of green sheet 20, which are laid one upon another, may be replaced by a kind of a green sheet 20 which can be used as the above two kinds of green sheet 20 only by varying the lamination direction, while maintaining the same position of the through holes 15, 16 and the same application form of the conductive pastes for conductor wiring 30, 40.

In this case, the manufacturing step can be simplified by reducing the number of kinds of the green sheet 20.

Figure 3D:
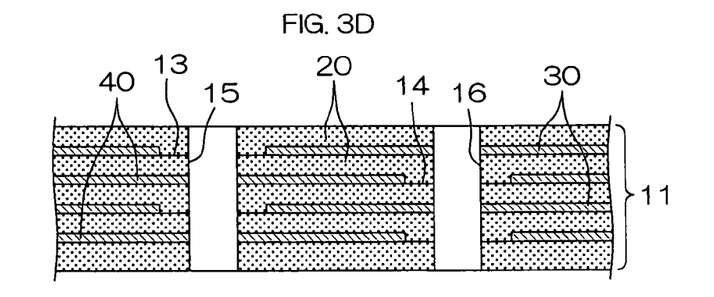

Then, the surface of the laminate 11 thus formed is irradiated with UV-YAG laser having a wavelength of 355 nm to form through holes 15, 16 and the conductive paste for conductor wiring, which overlaps with the through holes 15, 16, is removed (FIG. 3D).

The through hole 15 is formed so that it penetrates through the center of the non-coated region 13 with the conductive paste for conductor wiring 30 of the green sheet 20 as a base of the dielectric layer 2 which is the even-numbered layer, assuming that the uppermost layer is the first layer, in the dielectric block 1, and also overlaps with the region coated with the conductive paste for conductor wiring 40 of the green sheet 20 as a base of the dielectric layer 2 which is the odd-numbered layer, assuming that the uppermost layer is the first layer, in the dielectric block 1.

The through hole 16 is formed so that it penetrates through the center of the non-coated region 14 with the conductive paste for conductor wiring 40 of the green sheet 20 as a base of the dielectric layer 2 which is the odd-numbered layer, assuming that the uppermost layer is the first layer, in the dielectric block 1, and also overlaps with the region coated with the conductive paste for conductor wiring 30 of the green sheet 20 as a base of the dielectric layer 2 which is the even-numbered layer, assuming that the uppermost layer is the first layer, in the dielectric block 1.

The through holes 15, 16 having a predetermined diameter are preferably formed by repeatedly irradiating with laser using a trepanning technique of setting a diameter of laser to a diameter smaller than that of the through holes 15, 16 to be formed.

Figure 4A:
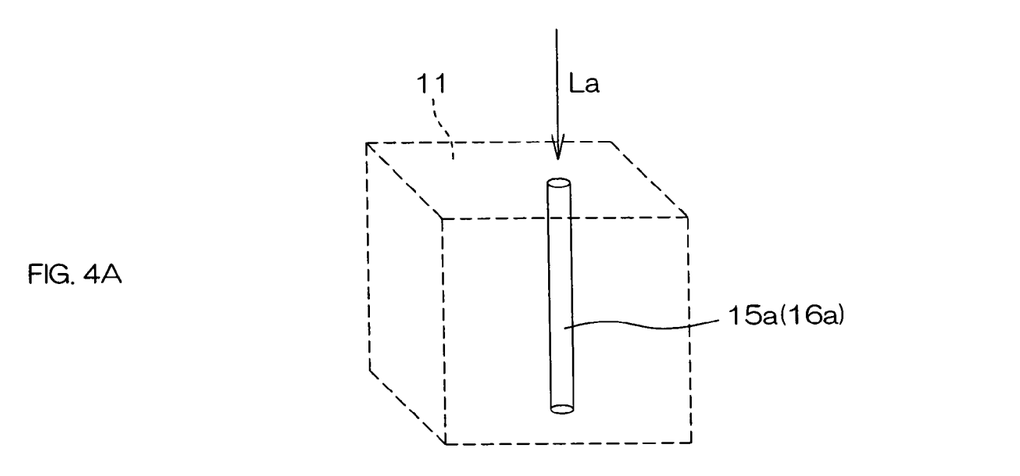
FIG. 4A to FIG. 4C are perspective views showing the step of forming through holes in laminated green sheets in the method shown in FIG. 3A to FIG. 3E.

More specifically, center through holes 15a, 16a are formed by irradiating substantially the center of the regions serving as through holes 15, 16 with laser La (FIG. 4A).

Figure 4B:
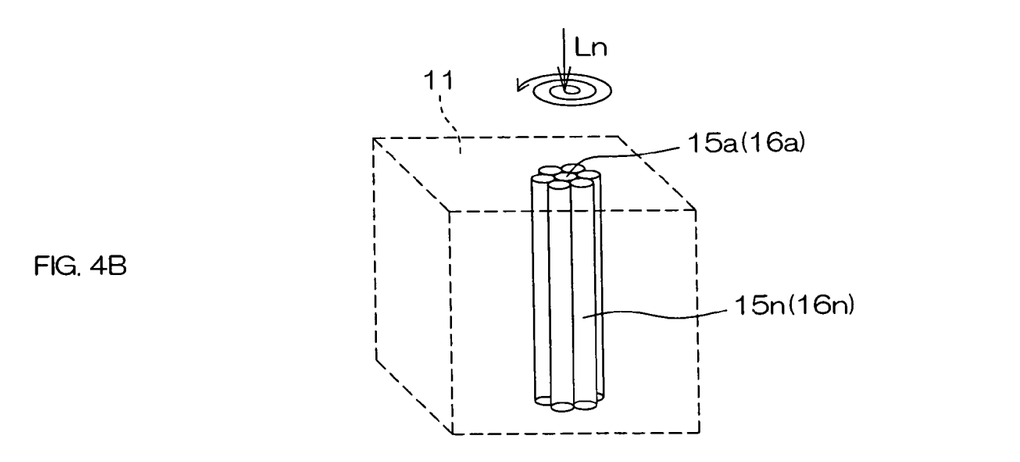

Then, peripheral through holes 15n, 16n are formed up to the peripheral portion of the regions serving as the through holes 15, 16 by gradually irradiating the outside with laser Ln in the spiral form while moving the irradiation position around the center through holes 15a, 16a (FIG. 4B)

Figure 4C:
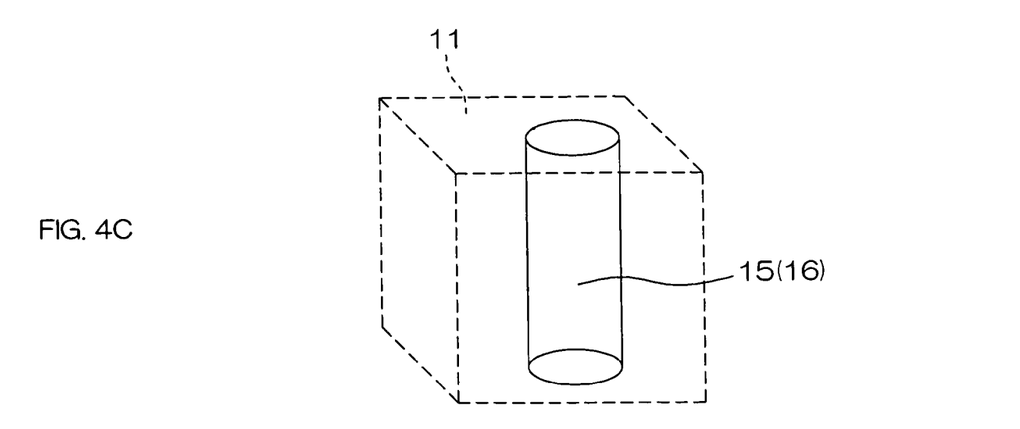

The through holes 15, 16 having a predetermined diameter are formed by repeating this operation (FIG. 4C).

According to the above operation, even when 100 or more green sheet 20 constituting the laminate 11 are laid one upon another, heat generated by irradiation with laser Ln is dissipated through the center through holes 15a, 16a.

Therefore, it is made possible to prevent such a problem from occurring that the portion exposed in the through holes 15, 16 of the conductive pastes for conductor wiring 30, 40 disappears as a result of vaporization due to heat, and thus failed to form satisfactory conductive connection of the internal electrodes 3, 4 with the via conductors 5, 6.

Since the conductive pastes for via conductor 50, 60 can be filled in the through holes 15, 16 in the state where the conductive pastes for conductor wiring 30, 40 are exposed in the through holes 15, 16, it is made possible to form satisfactory conductive connection of the internal electrodes 3, 4 with the via conductors 5, 6 by the subsequent firing step.

The pulse frequency of laser is preferably from 1 to 30 kHz (pulse period: 0.03 to 1 ms).

When the pulse frequency is less than 1 kHz, the productivity may be lowered because of long piercing time due to irradiation with laser.

When the pulse frequency is more than 30 kHz, the above-mentioned problem associated with vaporization of the conductive pastes for conductor wiring 30, 40 may arise because the quantity of heat generated by irradiation with laser increases.

In case the through holes are formed 15, 16 by irradiation with laser, it is preferred to remove decomposition products of organic substances such as organic binder resin, and ground ceramic powders by vacuum drawing.

The through holes 15, 16 may be formed by piercing using a microdrill, or punching.

The remained machining scraps are preferably removed by ultrasonic cleaning of the laminate 11 having the through holes 15, 16 formed therein while immersing in water.

Figure 3E:
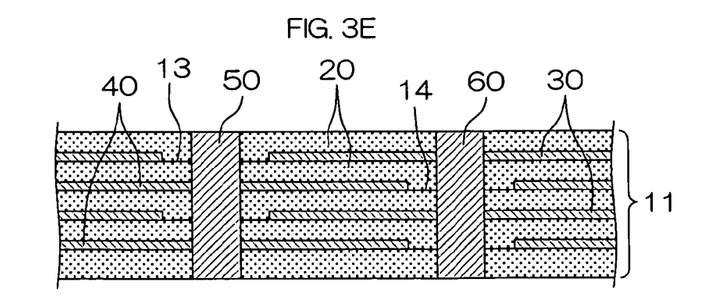

Then, the conductive pastes for via conductor 50, 60 are filled in the through holes 15, 16 thus formed by screen printing, for example (FIG. 3E).

Consequently, the conductive paste for conductor wiring 40 applied on the surface of the green sheet 20 as a base of the dielectric layer 2 which is the odd-numbered layer, assuming that the uppermost layer is the first layer, in the dielectric block 1 exposed in the through hole 15 is contacted with the conductive paste for via conductor 50 filled in the through hole 15.

Also the conductive paste for conductor wiring 30 applied on the surface of the green sheet 20 as a base of the dielectric layer 2 which is the even-numbered layer, assuming that the uppermost layer is the first layer, in the dielectric block 1 exposed in the through hole 16 is contacted with the conductive paste for via conductor 60 filled in the through hole 16.

As described above, when one green sheet 20 is formed in the size including a plurality of regions corresponding to a single dielectric layer 2, a laminate 11 is cut out every individual region using lever shears or the like. When the laminate 11 has a large thickness, it may be cut out by dicing.

The laminate thus cut out is put in a heating furnace and heated at a temperature of 250 to 400° C. to remove an organic binder resin and other organic substances, and then put in a great firing furnace and fired by heating to a temperature of 1250 to 1300° C. to form a dielectric block 1 shown in FIG. 1. Then, external electrodes 7, 8 are formed on the surface to obtain a laminated ceramic capacitor 10 shown in the same figure.

The constitution of the present invention is not limited to the above-mentioned embodiments and various modifications and improvements can be made without departing from the spirit or scope of the present invention.

For example, a plurality of the via conductors 5, 6 may be formed in the dielectric block 1, respectively.

Consequently, laminated ceramic capacitor 10 with less parasitic inductance can be provided.

In one dielectric block 1, a plurality of electrically independent capacitors may be formed. For example, capacitors having different capacities with internal electrode 3, 4 having different areas, each functioning as a capacitor, may be mounted in the same dielectric block 1.

As a matter of course, the constitution of the present invention can be applied to a ceramic wiring board which constitutes electronic components other than the laminated ceramic capacitor 10.

EXAMPLES

<Preparation of Conductive Paste for Via Conductor>

As the Ni powder, a first Ni powder having an average particle diameter of 6.7 μm, the surface of which is coated with a NiO layer, and a second Ni powder having an average particle diameter of 0.9 μm, the surface of which is coated with a NiO layer, were used. The content of the second Ni powder was set to 33 parts by weight based on 100 parts by weight of the first Ni powder.

An average thickness of the NiO layer, with which the surface of the Ni powder is coated, is the same in two kinds of Ni powders used in combination, and was set to four kinds of thicknesses, 0.7 nm, 2 nm, 15 nm and 25 nm.

As the Cu powder, a Cu powder having an average particle diameter of 0.1 μm, the surface of which is coated with a $SiO_2$ layer, were used.

An average thickness of the $SiO_2$ layer, with which the surface of the Cu powder is coated, was set to four kinds of thicknesses, 3 nm, 7 nm, 40 nm and 60 nm.

A conductive paste for via conductor was prepared by mixing a mixture of the above mentioned two kinds of Ni powders, the Cu powder and $BaTiO_3$ as the ceramic component, together with an organic binder resin and a solvent. As Ni powders and Cu powder, that from which the average thickness of NiO layers and $SiO_2$ layers differs was combined, as shown in Table 1.

The volume ratio Va of the Cu powder was set as 0.03, the volume ratio Vb of the mixture of the Ni powders was set as 0.97, and the volume ratio Vc of the ceramic component was set as 0.15.

That is, the weight of each ingredient which carried out weight conversion from the specific gravity of each ingredient was measured, and each measured ingredient was prepared so that the volume ratio of each ingredient might be set to the above-mentioned value.

<Formation of Via Conductors>

On a surface of a green sheet having a thickness of 0.7 μm which contains $BaTiO_3$ as a main component of ceramic component and $MgTiO_3$ as a subsidiary component, a conductive paste for conductor wiring containing Ni Powder was applied by screen printing, and a composite sheet was prepared. Pluralities of the composite sheets were laminated in the thickness direction, and the laminate was formed. Through holes having a diameter of 100 μm were formed in the predetermined position of the laminate, and the resultant through holes were filled with the conductive paste for via conductor, above mentioned.

A model of a ceramic wiring board was made by firing the laminated at peak temperature of 1310° C. for 24 hours after putting into a furnace until it takes out from a furnace, and then polished until the via conductors are exposed. The via holes were visually observed and electrical resistance was measured. The results are shown in Table 1.

TABLE 1

| NiO layer (nm) | SiO$_2$ layer (nm) | Evaluation |
|---|---|---|
| 0.7 | 3 | *1 |
| 2 | 3 | Good |
| 15 | 3 | Good |
| 25 | 3 | *2 |
| 0.7 | 7 | Good |
| 2 | 7 | Excellent |
| 15 | 7 | Excellent |
| 25 | 7 | Good |
| 0.7 | 40 | Good |
| 2 | 40 | Excellent |
| 15 | 40 | Excellent |
| 25 | 40 | Good |
| 0.7 | 60 | *1 |
| 2 | 60 | Good |
| 15 | 60 | Good |
| 25 | 60 | *3 |

*1: Positions where via conductors are isolated from the through holes were observed.
*2: Via conductors having a winding shape were observed.
*3: Electrical conductivity decreased because electrical resistance of via conductors increased.

As is apparent from the results shown in the table, the average thickness of the NiO layer, with which the surface of the Ni powder is coated, is preferably from 1.0 to 20 nm and the average thickness of the SiO$_2$ layer, with which the surface of the Cu powder is coated, is preferably from 5.0 to 50 nm.

The disclosure of Japanese Patent Application No. 2004-52531 filed on Feb. 26, 2004 is incorporated herein by reference.

The invention claimed is:

1. A conductive paste for via conductor, which is filled in through holes formed in a green sheet containing a ceramic component, and is fired together with the green sheet to form via conductors, characterized in that the conductive paste comprising a Cu powder having a glass layer formed on the surface, a Ni powder having a metal oxide layer formed on the surface, and a ceramic component.

2. The conductive paste for via conductor according to claim 1, wherein a volume ratio Va of the Cu powder, a volume ratio Vb of the Ni powder and a volume ratio Vc of the ceramic component satisfy all relations (1) to (5)

$$0.01 \leq Va \leq 0.1 \tag{1}$$

$$0.9 \leq Vb \leq 0.99 \tag{2}$$

$$0.01 \leq Vc \leq 0.3 \tag{3}$$

$$Va + Vb = 1 \tag{4}$$

$$1.01 \leq Va + Vb + Vc \leq 1.3 \tag{5}$$

3. The conductive paste for via conductor according to claim 1, wherein an average thickness of the glass layer formed on the surface of the Cu powder is from 5.0 to 50 nm, and an average thickness of the metal oxide layer formed on the surface of the Ni powder is from 1.0 to 20 nm.

4. The conductive paste for via conductor according to claim 1, wherein an average particle size of the Cu powder is from 0.1 to 1.0 μm, an average particle diameter of the Ni powder is from 0.1 to 10 μm, and an average particle diameter of the ceramic component is from 0.1 to 1.0 μm.

5. The conductive paste for via conductor according to claim 4, wherein two kinds of Ni powders having different average particle diameters are used in combination as the Ni powder.

6. A ceramic wiring board comprising via conductors formed by firing the conductive paste for via conductor of claim 1.

* * * * *